United States Patent [19]
Horn

[11] Patent Number: 5,452,801
[45] Date of Patent: Sep. 26, 1995

[54] CONVEYOR CASSETTE FOR WAFERS

[75] Inventor: George W. Horn, Concord, Mass.

[73] Assignee: Middlesex General Industries, Inc., Woburn, Mass.

[21] Appl. No.: 275,001

[22] Filed: Jul. 13, 1994

[51] Int. Cl.$^6$ ................................................. B05C 13/02
[52] U.S. Cl. ........................... 206/454; 118/500; 414/936; 414/940
[58] Field of Search ....................... 206/454, 328; 118/500; 211/41; 414/935, 936, 940

[56] References Cited

U.S. PATENT DOCUMENTS

| | | | |
|---|---|---|---|
| 4,311,427 | 1/1982 | Coad et al. | 414/936 X |
| 4,960,298 | 10/1990 | Moroi | 414/936 X |
| 5,348,151 | 9/1994 | Dressen | 206/454 |
| 5,350,069 | 9/1994 | Agwu | 206/454 |

*Primary Examiner*—Jacob K. Ackun
*Attorney, Agent, or Firm*—Jerry Cohen; Edwin H. Paul

[57] ABSTRACT

A cassette (2) or storage box for integrated circuit wafers or memory disks arranged and constructed for directly being placed onto the driven rollers (6) of contaminant free conveyors. The cassettes have a flat canted surface (10) for riding on the rollers. The cant is enough such that the loaded wafers lean against the sides of their individual pockets as the cassette travels. The leaning reduces damaged to the wafers by the vibrations involved with physically moving the cassette.

6 Claims, 1 Drawing Sheet

5,452,801

CONVEYOR CASSETTE FOR WAFERS

FIELD OF THE INVENTION

The present invention relates generally to moving integrated circuit wafers from one processing location to another via a driven roller conveyor system. In particular the present invention relates to a cassette for holding such integrated circuit wafers, where the cassette rides directly on the driven rollers.

BACKGROUND OF THE INVENTION

In the process of integrated circuit manufacturing there is need to handle (manually or automatically) small batches of silicon (or other material) wafers which comprise the substrate in and upon which integrated circuits are fabricated. Typically, the industry moves batches of 25 wafers at a time in cassettes or sealed or unsealed storage containers, hereinafter collectively referred to as cassettes, from one process to another as the finished integrated circuits are manufactured. In a similar fashion, the computer disk industry moves the disk substrates in batches using disk cassettes. Herein, wafers is deined to include integrated circuit wafers, disk substrates and other such items suitable for transporting in cassettes.

The inter-process handling in these industries is often done manually, but with the advent of clean conveyor means, such as the present assignee's CLEAN-DRIVE® conveyor, the afore referenced cassettes can now be automatically moved between each process location. However, a limitation of such use is the need for the cassettes to be loaded onto a pallet that rides on the conveyor system—the cassettes themselves are not suitable for riding directly on the conveyors. The use of pallets entails added costs due to the requirement to return the empty pallets, and the need to clean, maintain and store the pallets. Another limitation of the use of pallets is that the wafers will generally stand in a near vertical direction. The cassettes are constructed with a pocket for each wafer to prevent the wafers from hitting each other. But vibrations and changing the direction of movement inherent in conveyor systems may cause the wafers to bounce in the pockets possibly damaging the wafers.

It is an object of the present invention to provide an integrated wafer or disk cassette or storage box that does not require the use of a pallet by providing a cassette that will ride directly on driven rollers of a conveyor.

It is another object of the present invention to provide a cassette that lessens the possible damage to the wafers by the vibrations involved with moving the cassette via a conveyor.

It is another object of the present invention to provide a cassette that lessens contamination to the wafers.

Yet another object of the present invention is routinely handled at each wafer processing stop.

SUMMARY OF THE INVENTION

The foregoing objects are met in a cassette for moving on conveyor rollers, where the cassette has a chamber for retaining wafers, said cassette further comprising: two flat surfaces constructed on the cassette and arranged to ride on the drive rollers of the conveyor, each flat surface having a longitudinal direction aligned with the direction of movement of the cassette, and each surface canted at an angle such that the loaded wafers contained in the cheer are tilted when the cassette is moving along the conveyor.

In a preferred embodiment the two flat surfaces are formed two parallel bars constructed onto the cassette, said bars aligned with the direction of movement of the cassette, each bar having a flat bottom surface constructed and arranged to ride on the drive rollers of the conveyor apparatus, the bottom surface canted at an angle such that the loaded wafers or disks contained in the chamber are tilted when the cassette is moving along the conveyor.

An advantage of a cassette made in accordance with the present invention is that, while the cassette and enclosed wafers are titled while being transported from one location to another, when the cassette reaches a location the cassette will sit in an upright non-tilted manner in exisiting tooling. For example, when the cassette rests on its bottom surface the cassette and the enclosed wafers are not titled.

Another advantage of the tilted riding bars on the cassettes stems from the fact that the riding bars are only used for transportation and are not contacted while the cassette is stopped at a location for processing of the wafers. The none-use or contacting of the riding bars at such stops results in the riding bars not picking up any contaiminations from tools or other surfaces at these various stops. Since the riding bars will not pick up this contamination such contamination cannot migrate from the tools and/or surfaces at any stop to the riding bars, and then to the wafers themselves. In such a manner the tilted riding bars provide for a cleaner transportation of wafers, and, therefore, a cleaner total process of handling wafers.

In a preferred embodiment the angle of the canting of the flat surfaces ranges from about one degree to about ten degrees with about five degrees being most useful.

Other objects, features and advantages will be apparent from the following detailed description of preferred embodiments thereof taken in conjunction with the accompanying drawings in which:

DETAILED DESCRIPTION OF PREFERRED EMBODIMENTS

Figure 1:
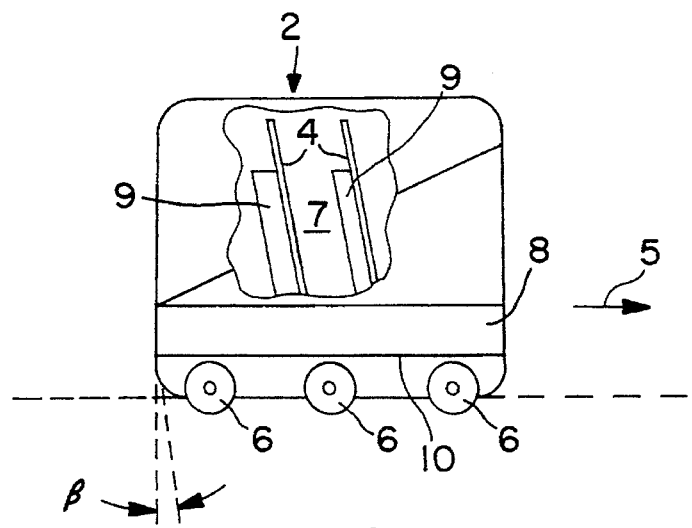
FIG. 1 is a pictorial of the present invention riding on a roller conveyor.

FIG. 1 shows a cassette 2 carrier for a batch of integrated circuit wafers 4. The carrier is supported on drive rollers 6 which move the cassette. As shown the preferable direction of motion is shown by the arrow 5, but the cassette may travel in either direction. When supported on the rollers the cassette is canted at angle β of about five degrees from vertical. In this position the wafers are also tilted at the five degrees. In such cassettes, each wafer is inserted into an individual pocket 7 that separates each wafer from the others. The five degree cant allows the wafers to lean on the pocket separators 9 to reduce wafer damage due to vibrations from the conveyor. Damage is caused when a wafer is accelerated away from the pocket separators followed by the wafer falling back against the separators. The resulting contact can knock microscopic or larger pieces off the wafer. A wafer losing even a very small piece is damaged, and the small pieces may then damage other wafers. Somewhat less obvious, but just as important, is that the resulting contact as the wafer strikes the separators of the cassette knocks microscopic or larger pieces off the separators. These pieces may then damage the wafers.

Figure 2:
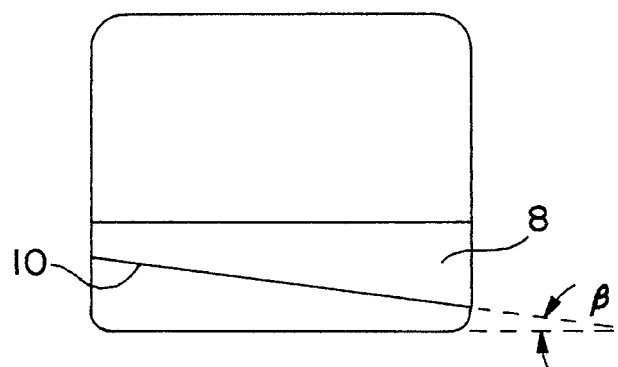
FIG. 2 is a side view of a cassette made in accordance with the present invention.

Still referring to FIG. 1, there is a side bar 8 along each side of the cassette, the bar having a flat bottom surface 10 that rides on the rollers. FIG. 2 shows the cassette standing vertically where the canted five degree bottom surface of the bar 8 is clearly shown.

Figure 3A:
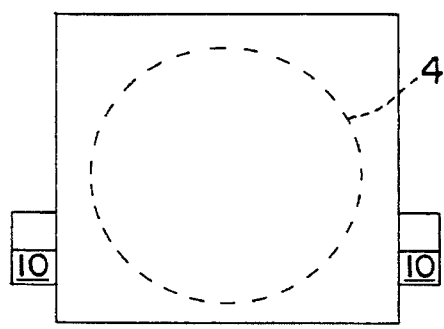
FIG. 3A and 3B are front views of different embodiments of the box of FIG. 2.
Figure 3B:
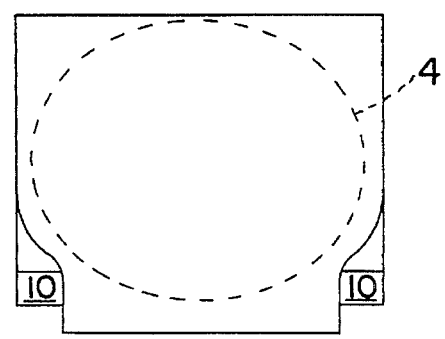

In FIG. 3A, a front view of FIG. 2, the bars 8 on either side of the cassette are seen. The bars are aligned in the direction that the cassette will travel. The wafers 4 are shown inside the cassette. Existing cassettes may be modified by attaching such bars to the cassette bodies and so allow the modified cassettes to be placed directly onto the roller conveyors. However, other preferred embodiments are available as shown in FIG. 3B. FIG. 3B shows an embodiment where the canted roller surfaces that engage the rollers are incused into the body of the cassette rather than being bars on the outside of the cassette.

It will now be apparent to those skilled in the art that other embodiments, improvements, details and uses can be made consistent with the letter and spirit of the foregoing disclosure and within the scope of this patent, which is limited only by the following claims, construed in accordance with the patent law, including the doctrine of equivalents.

What is claimed is:

1. A cassette for moving in a longitudinal direction on a roller conveyor apparatus, where the cassette has a chamber for retaining integrated circuit wafers or disk substrates, said cassette further comprising: means for separating said loaded wafers from each other, said means for separating defining a vertical direction substantially normal to said longitudinal direction, two flat surfaces constructed on the cassette and arranged to ride on the drive rollers of the conveyor apparatus, each flat surface extending in the longitudinal direction and substantially aligned with the direction of movement of the cassette, and each flat surface canted with respect to the longitudinal direction at an angle such that the loaded wafers or disks contained in the chamber are tilted against said means for separating when the cassette is moving along the conveyor.

2. A cassette for moving in a longitudinal direction on a roller conveyor apparatus, where the cassette has a chamber for retaining integrated circuit wafers or disk substrates, said cassette further comprising: means for separating said loaded wafers from each other, said means for separating defining a vertical direction substantially normal to said longitudinal direction, two parallel bars constructed onto the cassette, said bars aligned substantially in the longitudinal direction of movement of the cassette, said bars having flat bottom surfaces constructed and arranged to ride on the drive rollers of the conveyor apparatus, the bottom surfaces canted with respect to the longitudinal direction at an angle such that the loaded wafers or disks contained in the chamber are tilted against said means for separating when the cassette is moving along the conveyor.

3. A cassette as defined in claim 2 where the angle of the bars is from about one degree to about ten degrees, and where the bottom surfaces are coplanar.

4. A cassette as defined in claim 1 where the angle is about five degrees, and where the flat surfaces are coplanar.

5. Apparatus as defined in claim 1 where the angle is from about one to about ten degrees.

6. Apparatus as defined in claim 1 wherein means for separating comprise walls forming individual pockets, one pocket for one wafer.

\* \* \* \* \*